US008125416B2

(12) United States Patent
Kawabe

(10) Patent No.: US 8,125,416 B2
(45) Date of Patent: Feb. 28, 2012

(54) PIXEL DRIVE CIRCUIT FOR ORGANIC EL DISPLAY

(75) Inventor: Kazuyoshi Kawabe, Yokohama (JP)

(73) Assignee: Global OLED Technology LLC, Herndon, VA (US)

( * ) Notice: Subject to any disclaimer, the term of this patent is extended or adjusted under 35 U.S.C. 154(b) by 781 days.

(21) Appl. No.: 12/248,218

(22) Filed: Oct. 9, 2008

(65) Prior Publication Data

US 2009/0102759 A1    Apr. 23, 2009

(30) Foreign Application Priority Data

Oct. 17, 2007  (JP) ................. 2007-269679

(51) Int. Cl.
*G09G 3/30* (2006.01)
*G09G 3/12* (2006.01)
*G09G 3/26* (2006.01)
*G09G 5/10* (2006.01)

(52) U.S. Cl. ............. 345/76; 345/45; 345/77; 345/92; 345/95; 345/690

(58) Field of Classification Search .............. 345/76, 345/45, 77, 690
See application file for complete search history.

(56) References Cited

U.S. PATENT DOCUMENTS

| 2003/0184505 | A1* | 10/2003 | Inukai et al. ............. 345/76 |
| 2004/0090434 | A1* | 5/2004 | Miyazawa ............. 345/204 |
| 2006/0125408 | A1* | 6/2006 | Nathan et al. ............. 315/169.3 |
| 2006/0244687 | A1* | 11/2006 | Fish et al. ............. 345/76 |
| 2008/0001862 | A1* | 1/2008 | Kawabe ............. 345/82 |
| 2009/0058769 | A1* | 3/2009 | Kawabe ............. 345/76 |
| 2009/0096723 | A1* | 4/2009 | Kawabe ............. 345/77 |
| 2009/0233389 | A1* | 9/2009 | Miyairi et al. ............. 438/22 |

FOREIGN PATENT DOCUMENTS

WO    2006/020511    2/2006

* cited by examiner

*Primary Examiner* — Bipin Shalwala
*Assistant Examiner* — Benyam Ketema
(74) *Attorney, Agent, or Firm* — Morgan, Lewis & Bockius LLP

(57) ABSTRACT

A pixel circuit includes an organic EL element includes a storage capacitor charged with a data voltage; a first driving transistor responsive to charged voltage of the storage capacitor to supply drive current to the organic EL element; and a second driving transistor connected the storage capacitor and a predetermined power supply responsive to potential corresponding to a voltage drop in the organic EL element, and supplies charge current to the storage capacitor, circuitry for causing the second driving transistor to supply charge current to the storage capacitor from a time when the storage capacitor is charged with data voltage and the drive current from first driving transistor flows through the organic EL element. When drive current from the first driving transistor is stopped by changes in the charged voltage of storage capacitor, the drive current supplied to the organic EL element for a period corresponding to the data voltage.

7 Claims, 5 Drawing Sheets

PIXEL DRIVE CIRCUIT FOR ORGANIC EL DISPLAY

CROSS-REFERENCE TO RELATED APPLICATION

This application claims priority of Japanese Patent Application No. 2007-269679 filed Oct. 17, 2007 which is incorporated herein by reference in its entirety.

FIELD OF THE INVENTION

The present invention relates to a pixel circuit wherein an organic EL element is driven, and a display panel wherein pixels are arranged in the shape of a matrix.

BACKGROUND OF THE INVENTION

Heretofore, a liquid-crystal display device has come into wide use as a thin type display device. In the liquid-crystal display device, however, a display is presented in such a way that light from backlight is controlled by a liquid crystal. It is therefore difficult to display a perfect black level, and to make contrast sufficiently high.

On the other hand, an organic EL display of self-emission type has emission and non-emission controlled for every pixel in accordance with the contents of a picture. Therefore, the black level emitting no light can be expressed, and the contrast can be heightened to realize a high image quality (see WO 2006/020511).

Here, in the organic EL display, a light emission intensity and a light emission frequency differ for every pixel, so that the difference of degradation occurs between a pixel which emits bright light frequently and a pixel which hardly emits light. In addition, burn-in has been liable to occur in the pixel which emits the bright light frequently.

SUMMARY OF THE INVENTION

An object of the present invention is to compensate for a change in current caused by the degradation of a pixel.

In one aspect of performance of the invention, a pixel circuit is characterized by including an organic EL element which emits light in accordance with a drive current; a storage capacitor which is charged with a data voltage; a first driving transistor which is supplied with a charged voltage of the storage capacitor at a gate and supplies a drive current to the organic EL element; and a second driving transistor which connects the storage capacitor and a predetermined power supply, is supplied with a potential corresponding to a voltage drop in the organic EL element at a gate, and supplies a charge current to the storage capacitor; wherein the second driving transistor supplies the charge current to the storage capacitor from a time when the storage capacitor is charged with the data voltage and the drive current from the first driving transistor flows through the organic EL element, and, when the drive current from the first driving transistor is stopped by a change in the charged voltage of the storage capacitor, the drive current is supplied to the organic EL element for a period corresponding to the data voltage and corresponding to the voltage drop of the organic EL element.

Besides, it is suitable for the first driving transistor and the second driving transistor to be p-channel transistors, for a source of the first driving transistor to be connected to a first power supply, for a source of the second driving transistor to be connected to a second power supply, and for the second power supply to have a voltage higher than that of the first power supply.

Besides, it is suitable for the first driving transistor and the second driving transistor to be p-channel transistors, for sources of the first driving transistor and the second driving transistor to be connected to a first power supply, and for the second driving transistor to be of depletion type.

Besides, it is suitable for the storage capacitor to include a part which utilizes an organic layer of the organic EL element as a dielectric layer.

Further, in another aspect of performance of the invention, a display panel wherein pixels are arranged in a shape of a matrix, characterized in that each of the pixels includes an organic EL element which emits light in accordance with a drive current; a storage capacitor which is charged with a data voltage; a first driving transistor which is supplied with a charged voltage of the storage capacitor at a gate and supplies a drive current to the organic EL element; and a second driving transistor which connects the storage capacitor and a predetermined power supply, is supplied with a voltage externally set, at a gate, and supplies a charge current to the storage capacitor; wherein the second driving transistor supplies the charge current to the storage capacitor from a time when the storage capacitor is charged with the data voltage and the drive current from the first driving transistor flows through the organic EL element, and, when the drive current from the first driving transistor is stopped by a change in the charged voltage of the storage capacitor, the drive current is supplied to the organic EL element for a period corresponding to the data voltage and corresponding to the voltage set outside the pixel.

Besides, it is suitable for the voltage externally set to be alterable.

In accordance with the invention, a drive current is supplied to an organic EL element for a period corresponding to a data voltage and corresponding to the voltage drop of the organic EL element. Accordingly, when the organic EL element degrades to enlarge the voltage drop, a charge current to a storage capacitor becomes smaller, and the organic EL element emits light for a longer time to that extent. Therefore, the light emission period changes due to the degradation of the organic EL element, and the decreases of the current and a light emission intensity attributed to the degradation can be automatically corrected by the lengthening of the light emission period.

DESCRIPTION OF THE PREFERRED EMBODIMENTS

Embodiments of the present invention will be described with reference to the drawings.

Figure 1:
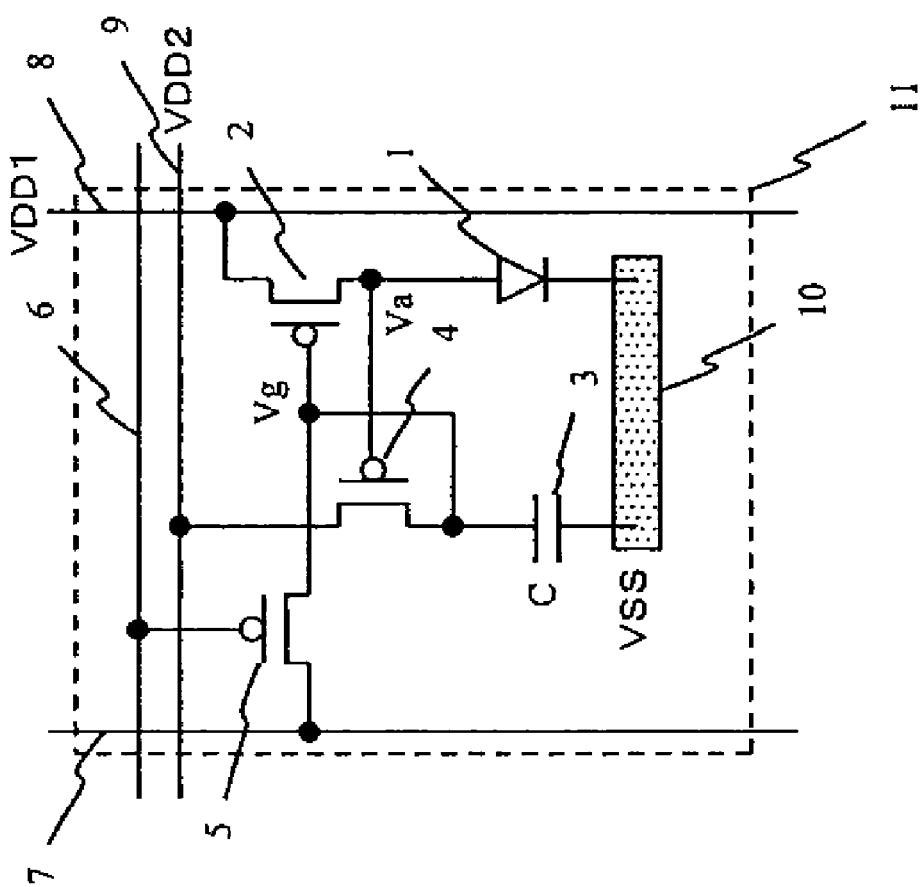
FIG. 1 is a diagram showing a pixel circuit in an embodiment of the present invention.

FIG. 1 shows a pixel 11 which is configured of three p-channel transistors 2, 4 and 5, and a storage capacitor 3 of capacitance C. The cathode of an organic EL element 1 is connected to a cathode electrode 10 which is common to all pixels and to which a power supply potential VSS is applied, while the anode of the organic EL element 1 is connected to the drain terminal of the first driving transistor 2 and the gate terminal of the second driving transistor 4. The gate terminal of the first driving transistor 2 is connected to the drain terminal of the second driving transistor 4 and the source terminal of the gate transistor 5. The gate terminal of the gate transistor 5 is connected to a gate line 6, and the drain terminal thereof is connected to a data line 7. Besides, the gate line 6 is supplied with a selection voltage, and the data line 7 is supplied with a data voltage. Incidentally, the gate transistor 5 can be an n-channel transistor. In that case, the gate transistor 5 can be selected and turned ON by setting the gate line 6 at a "High" voltage.

The source terminal of the first driving transistor 2 is connected to a first power supply line 8, and the source terminal of the second driving transistor 4 is connected to a second power supply line 9. The first power supply line 8 and the second power supply line 9 are respectively supplied with a first power supply potential VDD1 and a second power supply potential VDD2, which are different from each other.

The drain terminal of the second driving transistor 4 is connected to the cathode electrode 10 through the storage capacitor 3. Here, insofar as one end of the storage capacitor 3 is connected to the drain terminal of the second driving transistor 4, the other end thereof can be connected to the first power supply line 8 or the second power supply line 9.

Incidentally, a display panel is configured in such a way that the pixels 11 are arranged in the shape of a matrix, and that various driving circuits are arranged around the pixels 11.

In such a pixel 11, when the gate line 6 is selected (is supplied with a "Low" voltage) and the data line 7 is supplied with the "Low" voltage for turning ON the first driving transistor 2, the first driving transistor 2 is turned ON, and a current flows through the organic EL element 1 so as to emit light. The anode potential Va of the organic EL element 1 rises to close to the first power supply potential VDD1 until the second driving transistor 4 is turned OFF. Therefore, the "Low" voltage supplied to the data line 7 is written into the storage capacitor 3. Subsequently, when the gate line 6 is made non-selected (is supplied with the "High" voltage), the voltage written into the storage capacitor 3 becomes definite.

Here, when the second power supply potential VDD2 is set at a voltage which is greater than the anode potential Va at the time of the turn-ON of the organic EL element 1, by the threshold voltage Vth2 of the second driving transistor 4 (that is, VDD2>Va+Vth2 holds), a constant current Ic is supplied from the second power supply potential VDD2 to the second driving transistor 4, and the storage capacitor 3 is charged. The charge current Ic is continued until the drain potential of the second driving transistor 4 becomes (VDD2−Vth2). However, the gate voltage Vg of the first driving transistor 2 becomes higher than (VDD1−Vth1) (the threshold voltage of the first driving transistor 2) before the voltage (VDD2−Vth2) is reached, and the first driving transistor 2 is turned OFF. Thus, the anode potential Va of the organic EL element 1 abruptly lowers to close to the potential VSS. Therefore, the second driving transistor 4 is turned ON, and the drain terminal thereof becomes substantially the potential VDD2.

Figure 2:
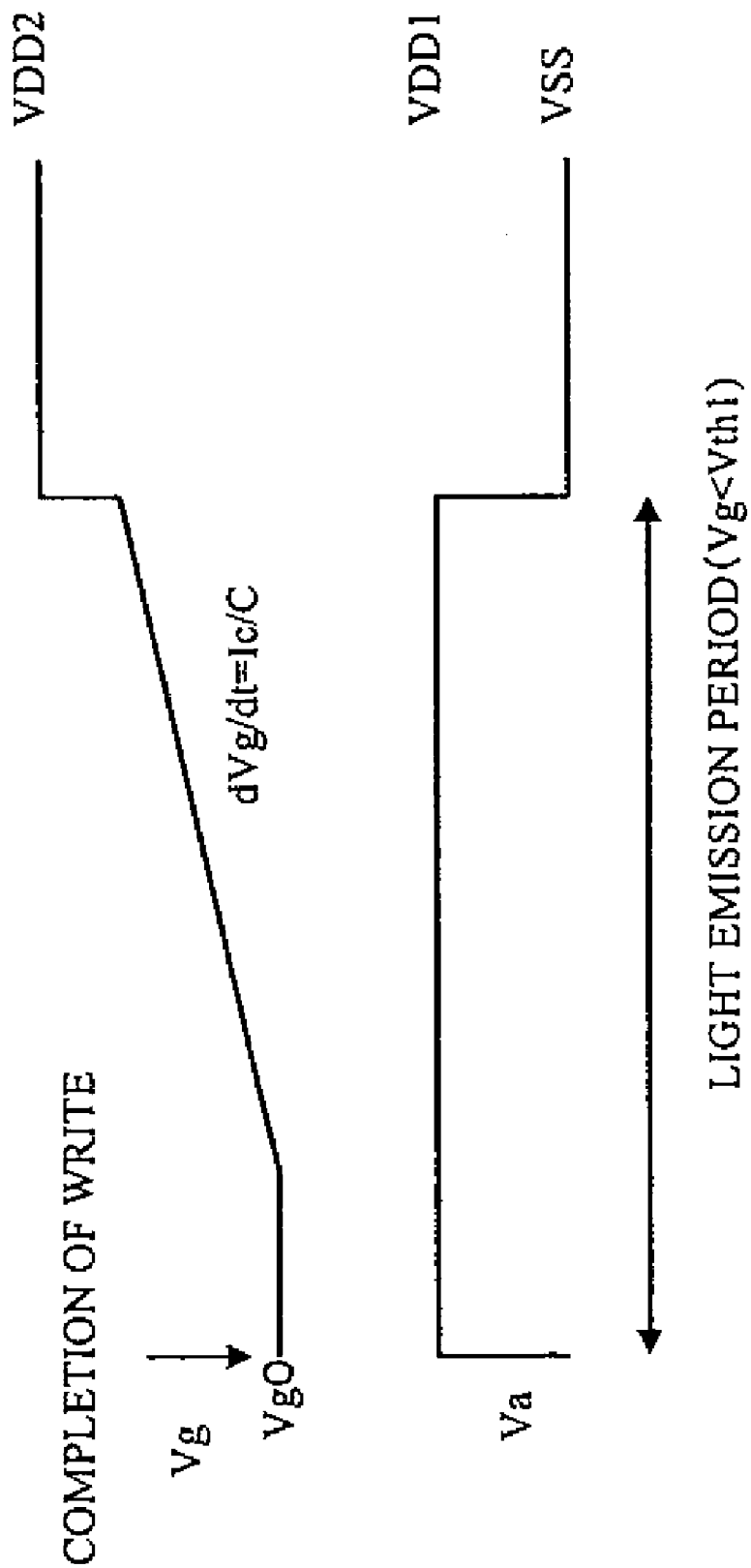
FIG. 2 is a diagram showing the change states of voltages.

FIG. 2 shows the transitions of the gate voltage Vg of the first driving transistor 2 and the anode potential Va of the organic EL element 1, versus time.

After the completion of the write, the storage capacitor 3 is gradually charged from the initial potential Vg by the constant current Ic based on the second driving transistor 4, and the potential Vg rises at a rate $dVg/dt=Ic/C$ (Formula 1). In a period (light emission period) for which the potential Vg is lower than the threshold voltage Vth1 of the first driving transistor 2, this first driving transistor 2 is ON, and hence the light emission continues owing to the flow of the current through the organic EL element 1. However, when the charging proceeds and exceeds the threshold voltage Vth1, the organic EL element 1 is extinguished. The light emission period t is expressed by the initial potential Vg0 of the potential Vg and the change rate of the potential Vg indicated by (Formula 1), as follows: $t=(C/Ic)*(VDD2-Vth1-Vg0)$ (Formula 2)

According to (Formula 2), the light emission period t is controllable by the Vg initial potential Vg0 at the completion of the write and the charge current Ic. More specifically, when an analog voltage Vg0 is supplied onto the data line 7, a light emission period corresponding to the analog voltage Vg0 is obtained. The light emission period can be controlled so as to become longer by applying a lower analog potential Vg0, and to become shorter by applying a higher analog potential Vg0.

In general, the organic EL element 1 becomes higher in resistance when it has degraded. Accordingly, when a current is kept flowing through the organic EL element 1 for a long time by applying a constant voltage thereto, the current lowers, and a light emission intensity consequently degrades. Therefore, the burn-in of the pixel is liable to occur, and this has been the problem of constant-voltage drive.

Also in the pixel 11 in FIG. 1, when the organic EL element 1 continues to emit light for a long period, currents which flow through the organic EL element 1 and the first driving transistor 2 lower similarly. When the current flowing through the organic EL element 1 decreases, the voltage drop of the first driving transistor 2 becomes small on account of the ON-resistance thereof, and the anode potential Va of the organic EL element 1 rises. In addition, the gate potential of the second driving transistor 4 also rises due to the rise of the anode potential Va, so that the charge current Ic becomes small. When the charge current Ic decreases, the light emission period becomes longer in conformity with (Formula 2). Therefore, the light emission period changes due to the degradation of the organic EL element 1, and the decreases of the current and the light emission intensity attributed to the degradation are automatically corrected by the longer light emission period.

Here, the light emission period t depends upon the charge current Ic and the capacitance C as indicated by (Formula 2), and it is therefore desirable to decrease the dispersions of these quantities. By way of example, for the suppression of the dispersion of the capacitance C of the storage capacitor 3, it is desirable that the capacitance C can be ensured larger.

Figure 3:
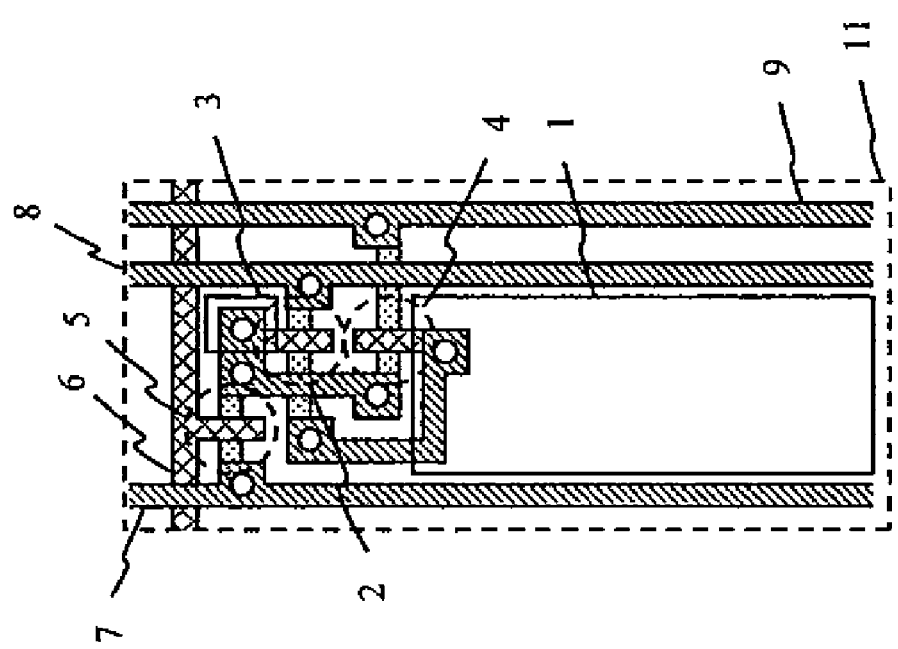
FIG. 3 is a diagram showing the layout of a pixel.

The layout (plan view) of the pixel 11 in FIG. 1 is shown in FIG. 3. The data line 7 is arranged in a vertical direction on a left side, while the first power supply line 8 and the second power supply line 9 are arranged in vertical directions on a right side. Besides, the gate line 6 is arranged in a horizontal direction on the upper side of the pixel. A semiconductor layer is connected onto the data line 7 by a contact and is extended rightward from there, and part of the gate line 6 protrudes to the semiconductor layer, whereby the gate transistor 5 is formed. A wiring line is extended downwards from the drain of the gate transistor 5, and is connected to the drain of the second driving transistor 4. A semiconductor layer stretched from the drain of the second driving transistor 4 is connected to the second power supply line 9 through a contact, and the connected part of the semiconductor layer becomes the source of the second driving transistor 4. Besides, the gate electrode of the first driving transistor 2 is connected to the drain of the gate transistor 5 through a contact. The first driving transistor 2 is arranged at a right-ward shifted position under the gate transistor 5, its source is connected to the first power supply line 8, and its drain has a semiconductor layer which is extended in a horizontal direction and which is connected to a wiring line led to the anode of the organic EL element 1. Besides, the gate electrode of the second driving transistor 4 is extended from a contact which connects the anode of the organic EL element 1 and a wiring line led from the drain of the second driving transistor 4. Further, a semiconductor layer forming the drain of the gate transistor 5 is stretched in a rightward direction, and it the storage capacitor 3 is formed between the semiconductor layer and a wiring line extended from the gate electrode of the first driving transistor 2.

Figure 4:
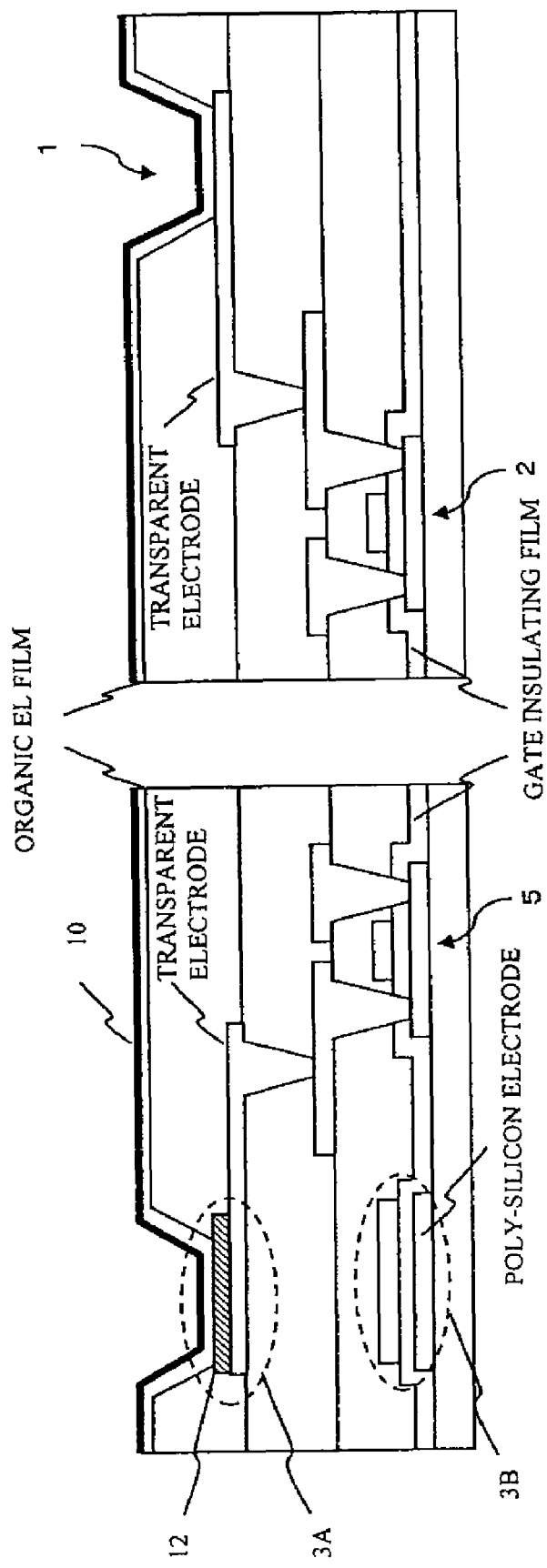
FIG. 4 is a diagram showing the sectional configuration of the essential portions of the pixel circuit.

Here, a method as shown in FIG. 4 by way of example can be employed in order to make the capacitance C of the storage capacitor 3 larger. FIG. 4 shows the sectional shapes of a storage capacitor 3A which is an example of a storage capacitor employing the organic EL element 1 as a dielectric, and a storage capacitor 3B which is formed of an inorganic semiconductor such as poly-silicon, in the layout diagram of the pixel 11 in FIG. 1 as shown in FIG. 3. Usually, the organic EL element 1 is formed in such a way that, as shown in FIG. 4, an organic EL film being about 100 nm thick and a cathode film (cathode electrode 10) are successively deposited on a transparent electrode (anode). However, in a place where the storage capacitor 3A is formed, an insulating film 12 of silicon oxide, silicon nitride or the like is formed between the transparent electrode (forming the anode of the organic EL element 1) and the organic EL film. That is, referring to FIG. 3, at a part extended rightward from the gate transistor 5 (a part to which the gate electrode of the driving transistor 2 is connected), the transparent electrode is formed simultaneously with the anode of the organic EL element 1 as shown at a square indicated by a solid line. Besides, the organic EL film is formed on the transparent electrode through the thin insulating film 12. Incidentally, although the insulating film 12 on the transparent electrode is indicated by hatched lines in FIG. 4, it can be formed of the same material as that of an insulating film 12 at any other part, or it can be formed of a different material. Thus, the storage capacitor 3A is formed at this part. Incidentally, since the insulating film 12 is not formed at the part of the organic EL film 1 shown in FIG. 3, the usual organic EL element 1 is formed at this part. In this manner, the storage capacitor 3A and the organic EL element 1 can be simultaneously formed. Besides, the organic EL film is formed to be very thin, and it is comparatively higher in permittivity than any other organic film, so that the capacitance value C can be enlarged.

In order to form the storage capacitor 3B, one electrode of which is made of poly-silicon or the like forming the drain of the second driving transistor 4, the gate insulating film of this transistor can be interposed between a poly-silicon electrode formed by doping with an impurity and another metal. Incidentally, the other metal is connected to the power supply VSS or another power supply.

The organic EL film and the poly-silicon electrode are easy to optically activate. Therefore, the storage capacitor 3 formed using them has the advantage that, even when the charge current Ic of the second driving transistor 4 increases due to external light or the like, the permittivities of the organic EL film and the poly-silicon electrode increase similarly under the influence of the external light, so the capacitance C increases. Consequently, the influence of the external light on the light emission period t is reduced in conformity with (Formula 2). Since both the constituents act similarly against the change in temperature, the fluctuation of the light emission period t can be suppressed to a minimum.

Further, the fluctuation can be similarly suppressed in such a way that the magnitude of the external light or the magnitude of the temperature change is measured by a sensor or the like, and that the potential VDD2 of the second power supply line 9 is raised or lowered in accordance with the measured value, thereby to control the charge current Ic.

With the pixel 11 in FIG. 1, the light emission period is controlled by an analog potential in the case where the data supplied to the data line 7 is analog, as stated above. On the other hand, in a case where the data supplied to the data line 7 is digital, a binary voltage is written to the pixel 11 so as to control a gradation. In the case of digital data, a multi-gradation display can be presented by employing a plurality of subframes or by employing a plurality of subpixels.

In a case where the second driving transistor 4 is made a depletion type so as to turn ON whenever the gate voltage thereof is lower than the potential VDD1, the second power supply line 9 can be omitted. In that case, the source terminal of the second driving transistor 4 can be connected to the first power supply line 8. With the second driving transistor 4 of the depletion type, even when the anode potential Va at the flow of the current through the organic EL element 1 is near the potential VDD1, some charge current Ic can be caused to flow, so that the pixel 11 can be normally operated and can be structurally simplified.

Figure 5:
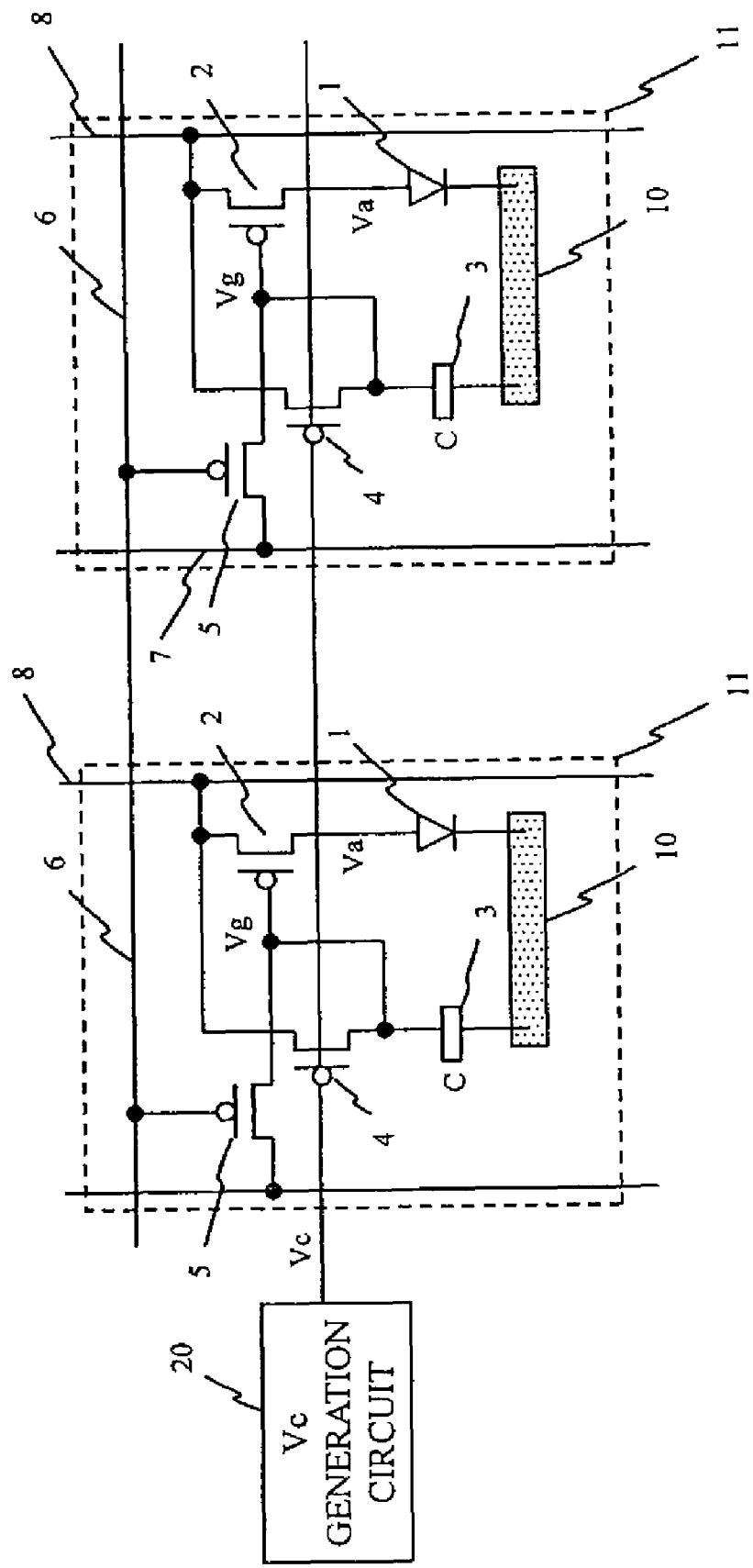
FIG. 5 is a diagram showing a pixel circuit in another embodiment of the invention.

The charge currents Ic can be controlled by disposing a Vc generation circuit 20 outside the pixels and applying a voltage Vc from this circuit as shown in FIG. 5, unlike in the configuration in which the gate terminal of the second driving transistor 4 is connected to the node between the organic EL element 1 and the first driving transistor 2. The Vc generation circuit 20 can be configured as the peripheral circuit of the display panel, or can be formed in an IC or the like disposed separately, so as to supply the voltage Vc to the display panel.

In the case of this configuration, the degradations of the individual organic EL elements 1 are not corrected, but the degradations of all the elements 1 are simultaneously corrected. That is, the voltage Vc is externally applied, whereby the charge currents Ic can be controlled from outside without being influenced by the organic EL elements 1. Therefore, the fluctuations of the anode potentials Va of the organic EL elements 1 that are liable to occur due to the temperature difference between the central part and outer side of a screen can be prevented from influencing the corrections. The current fluctuations of the first driving transistors 2 and the organic EL elements 1 attributed to external light and a temperature change are avoidable in such a way that the Vc generation circuit 20 raises or lowers the voltage Vc on the basis of data measured by the sensors stated before.

The invention has been described in detail with particular reference to certain preferred embodiments thereof, but it will be understood that variations and modifications can be effected within the spirit and scope of the invention.

PARTS LIST

1 organic EL element
2 driving transistor (p-channel)
3 storage capacitor
3A storage capacitor
3B storage capacitor
4 driving transistor (p-channel)
5 gate transistor (p-channel)
6 gate line
7 data line
8 power supply line
9 power supply line
10 cathode electrode
11 pixel
12 thin insulating film
20 Vc generation circuit

The invention claimed is:
1. A pixel circuit, comprising:
an organic EL element configured to emit light according to a drive current;
a storage capacitor configured to be charged with a data voltage;

a first driving transistor responsive to a charged voltage of the storage capacitor and configured to supply a drive current to the organic EL element;
a second driving transistor connected to the storage capacitor and a predetermined power supply responsive to a potential corresponding to a voltage drop in the organic EL element, the second driving transistor configured to:
supply a charge current to the storage capacitor; and
supply charge current to the storage capacitor from a time when the storage capacitor is charged with the data voltage to when the drive current from the first driving transistor flows through the organic EL element,
wherein, when the drive current from the first driving transistor is stopped by a change in the charged voltage of the storage capacitor, the drive current is supplied to the organic EL element for a period corresponding to the data voltage and corresponding to a voltage drop of the organic EL element,
wherein the first driving transistor and the second driving transistor comprise p-channel transistors,
wherein a source of the first driving transistor is connected to a first power supply,
wherein a source of the second driving transistor is connected to a second power supply, and
wherein the second power supply has a voltage higher than that of the first power supply.

2. The pixel circuit of claim 1, wherein the storage capacitor comprises a part configured to utilize an organic layer of the organic EL element as a dielectric layer.

3. A pixel circuit, comprising:
an organic EL element configured to emit light according to a drive current;
a storage capacitor configured to be charged with a data voltage;
a first driving transistor responsive to a charged voltage of the storage capacitor and configured to supply a drive current to the organic EL element;
a second driving transistor connected to the storage capacitor and a predetermined power supply responsive to a potential corresponding to a voltage drop in the organic EL element, the second driving transistor configured to:
supply a charge current to the storage capacitor; and
supply charge current to the storage capacitor from a time when the storage capacitor is charged with the data voltage to when the drive current from the first driving transistor flows through the organic EL element,
wherein, when the drive current from the first driving transistor is stopped by a change in the charged voltage of the storage capacitor, the drive current is supplied to the organic EL element for a period corresponding to the data voltage and corresponding to a voltage drop of the organic EL element,
wherein the first driving transistor and the second driving transistor comprise p-channel transistors,
wherein sources of the first driving transistor and the second driving transistor are connected to a first power supply, and
wherein the second driving transistor is of depletion type.

4. The pixel circuit of claim 3, wherein the storage capacitor comprises a part configured to utilize an organic layer of the organic EL element as a dielectric layer.

5. A display panel comprising pixels arranged in a shape of a matrix, each of the pixels comprising:
an organic EL element configured to emit light in accordance with a drive current;
a storage capacitor configured to be charged with a data voltage;
a first driving transistor supplied with a charged voltage of the storage capacitor at a gate and configured to supply a drive current to the organic EL element; and
a second driving transistor which connects the storage capacitor and a predetermined power supply, supplied with a voltage externally set, and configured to:
supply a charge current to the storage capacitor;
supply charge current to the storage capacitor from a time when the storage capacitor is charged with the data voltage to when the drive current from the first driving transistor flows through the organic EL element,
wherein, when the drive current from the first driving transistor is stopped by a change in the charged voltage of the storage capacitor, the drive current is supplied to the organic EL element for a period corresponding to the data voltage and corresponding to the voltage set outside the pixel,
wherein the first driving transistor and the second driving transistor comprise p-channel transistors,
wherein a source of the first driving transistor is connected to a first power supply,
wherein a source of the second driving transistor is connected to a second power supply, and
wherein the second power supply has a voltage higher than that of the first power supply.

6. The display panel of claim 5, wherein the voltage externally set is alterable.

7. A display panel comprising pixels arranged in a shape of a matrix, each of the pixels comprising:
an organic EL element configured to emit light in accordance with a drive current;
a storage capacitor configured to be charged with a data voltage;
a first driving transistor supplied with a charged voltage of the storage capacitor at a gate and configured to supply a drive current to the organic EL element; and
a second driving transistor which connects the storage capacitor and a predetermined power supply, supplied with a voltage externally set, and configured to:
supply a charge current to the storage capacitor;
supply charge current to the storage capacitor from a time when the storage capacitor is charged with the data voltage to when the drive current from the first driving transistor flows through the organic EL element,
wherein, when the drive current from the first driving transistor is stopped by a change in the charged voltage of the storage capacitor, the drive current is supplied to the organic EL element for a period corresponding to the data voltage and corresponding to the voltage set outside the pixel,
wherein the first driving transistor and the second driving transistor comprise p-channel transistors,
wherein sources of the first driving transistor and the second driving transistor are connected to a first power supply, and
wherein the second driving transistor is of depletion type.

* * * * *